(12) United States Patent
Rofougaran

(10) Patent No.: US 7,672,800 B2
(45) Date of Patent: Mar. 2, 2010

(54) METHOD AND SYSTEM FOR CONTROLLING A DELAY CIRCUIT FOR GENERATION OF SIGNALS UP TO EXTREMELY HIGH FREQUENCIES

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 255 days.

(21) Appl. No.: 11/860,152

(22) Filed: Sep. 24, 2007

(65) Prior Publication Data

US 2009/0079482 A1    Mar. 26, 2009

(51) Int. Cl.
*G01M 19/00*    (2006.01)
(52) U.S. Cl. .................................................. 702/89
(58) Field of Classification Search ............. 702/89, 702/64, 65, 79, 182–185, 189, 190
See application file for complete search history.

(56) References Cited

U.S. PATENT DOCUMENTS 5,809,064 A * 9/1998 Fenton et al. ............... 375/150
2002/0153972 A1 * 10/2002 Hershtig ..................... 333/202
2007/0273422 A1 * 11/2007 Kuo et al. .................... 327/261

* cited by examiner

*Primary Examiner*—Edward Raymond
(74) *Attorney, Agent, or Firm*—McAndrews, Held & Malloy, Ltd.

(57) ABSTRACT

Aspects of a method and system for generation of signals up to extremely high frequencies using a delay circuit are provided. In this regard, a variable delay circuit may be adjusted such that an output signal generated by the delay circuit may be twice the frequency of a signal input to the delay circuit. The adjustment may be via an variable capacitance and/or a variable number of delay elements utilized to generate the output signal. Moreover, the adjustment may be based on a signal strength of the output signal. In this regard, the delay may be adjusted to maximize the signal strength of the output signal. The input signal may be delayed to generate a second signal that is 90° phase shifted relative to the input signal. The second signal and the input signal may be mixed to generate the output signal. The output signal may be filtered by a bandpass filter centered at twice the frequency of the input signal. Accordingly, the center frequency of the bandpass filter may be tunable.

24 Claims, 6 Drawing Sheets

METHOD AND SYSTEM FOR CONTROLLING A DELAY CIRCUIT FOR GENERATION OF SIGNALS UP TO EXTREMELY HIGH FREQUENCIES

CROSS-REFERENCE TO RELATED APPLICATIONS/INCORPORATION BY REFERENCE

This patent application makes reference to:

U.S. patent application Ser. No. 11/860,076 filed on even date herewith;

U.S. patent application Ser. No. 11/860,106 filed on even date herewith; and

U.S. patent application Ser. No. 11/860,128 filed on even date herewith.

Each of the above stated applications is hereby incorporated herein by reference in its entirety.

FIELD OF THE INVENTION

Certain embodiments of the invention relate to signal processing. More specifically, certain embodiments of the invention relate to a method and system for controlling a delay circuit for generation of signals up to extremely high frequencies.

BACKGROUND OF THE INVENTION

The number and types of wireless devices and wireless standards has seen rapid growth in recent years and is unlikely to slow anytime soon. Consequently, available frequency bands, which are regulated by organizations such as the FCC in the USA, are becoming increasingly scarce. Moreover, existing frequency bands are becoming increasingly congested with wireless traffic from the plethora of users and devices in existence. In this regard, designing devices that can reliably operate in such noisy frequency bands is becoming increasingly difficult and costly. Accordingly, efforts exist to develop wireless technologies which operate at higher, less congested frequencies.

For example, in 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this designated portion of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. In this regard, there may be certain drawbacks associated with 60 GHz communications. For example, 60 GHz signals may provide markedly different communications channel and propagation characteristics. In this regard, 60 GHz radiation is partly absorbed by oxygen in the air. Accordingly, 60 GHz communications suffer from increased attenuation with distance as compared to, for example, 2.4 GHz. On the other hand, there may be advantages associated with 60 GHz communications. For example, since a very large bandwidth of 7 GHz is available, very high data rates may be achieved.

Shrinking features size of CMOS processes, for example, is one factor enabling development products and technologies for 60 GHz communications. However, even when fabricated on the smallest processes, conventional methods and circuit topologies are often unable to realize signal generation circuits which can generate signals sufficiently high in frequency to enable technologies such as 60 GHz communications.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for controlling a delay circuit for generation of signals up to extremely high frequencies, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for controlling a delay circuit for generation of signals up to extremely high frequencies. In this regard, a variable delay circuit may be adjusted such that an output signal generated by the delay circuit may be twice the frequency of a signal input to the delay circuit. The adjustment may be via an variable capacitance and/or a variable number of delay elements utilized to generate the output signal. Moreover, the adjustment may be based on a signal strength of the output signal. In this regard, the delay may be adjusted to maximize the signal strength of the output signal. The input signal may be delayed to generate a second signal that is 90° phase shifted relative to the input signal. The second signal and the input signal may be mixed to generate the output signal. The output signal may be filtered by a bandpass filter centered at twice the frequency of the input signal. Accordingly, the center frequency of the bandpass filter may be tunable.

Figure 1:
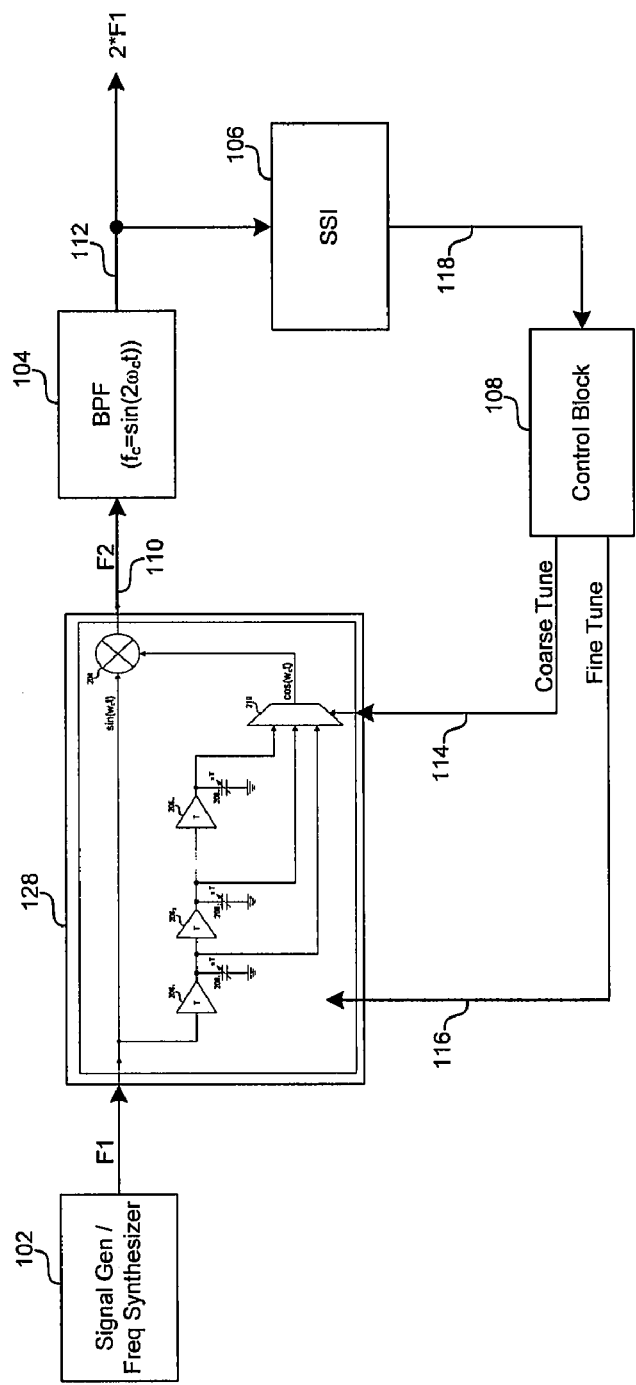
FIG. 1 is a block diagram illustrating a system for controlling a delay circuit for generation of signals up to extremely high frequencies, in accordance with an embodiment of the invention.

FIG. 1 is a block diagram illustrating a system for controlling a delay circuit for generation of signals up to extremely high frequencies, in accordance with an embodiment of the invention. Referring to FIG. 1 there is shown a delay circuit 128, a signal generator 102, a bandpass filter 104, a signal strength indicator (SSI) 106, and control block 108.

Figure 3:
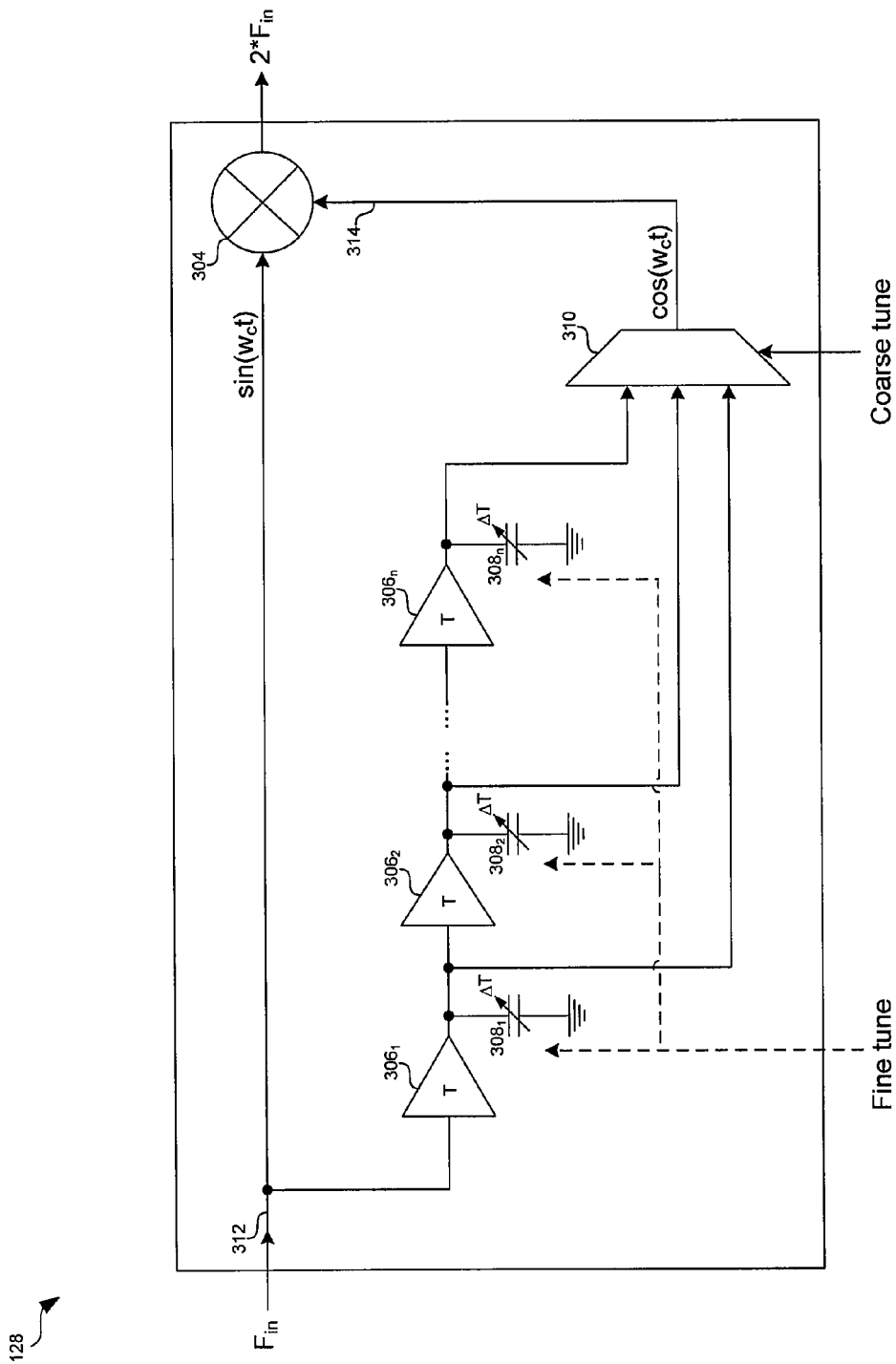
FIG. 3 is a block diagram illustrating the use of a delay circuit for the generation of signals of up to extremely high frequencies, in accordance with an embodiment of the invention.

The delay circuit 128 may be similar to or the same as the delay circuit 128 disclosed in FIG. 3. Accordingly, the delay circuit 128 may output a signal 110 which may be at twice the reference frequency F1.

The signal generator 102 may comprise suitable logic, circuitry, and/or code that may enable generating a sine wave. In this regard, the signal generator 102 may be enabled to generate a reference frequency for use, for example, as a local oscillator. For example, the signal generator 102 may comprise one or more PLLs. Accordingly, the maximum frequency which the signal generator 102 may be capable of generating may be dependent upon, for example, settling times and/or physical constraints.

The bandpass filter 104 may comprise suitable, logic, and/or code that may enable passing frequencies at or near 2*F1 and attenuating other frequencies. In this regard, the bandwidth, attenuation, and/or center frequency of the filter 104 may be adjustable based on one or more control signals. Accordingly, the filters 104 may receive one or more control signals from the processor 625 of FIG. 6.

The SSI 106 may comprise suitable logic, circuitry, and/or code that may enable determining signal. In this regard, the SSI 106 may, for example, be enabled to measure current, voltage and/or power of the signal 112. Additionally, the SSI 106 may be enabled to convey the strength measurement to the control block 108. In various embodiments of the invention, the SSI 106 may output one or more digital and/or analog signals 118 representative of the strength of the signal 112.

The control block 108 may comprise suitable logic, circuitry, and/or code that may enable controlling the delay circuit 128 in response to the signal strength 118. In this regard, the control block 108 may be enabled to adjust the coarse tune input 114 and fine tune input 116 of the delay circuit 128 in response to signal strength measurements received from the SSI 106. Accordingly, the control block may be enabled to implement one or more algorithms and/or routines for maximizing the power out of the delay circuit 128. In various embodiments of the invention, the control block 108 may comprise one or more processors and/or may be implemented in one or more processors such as the processors 625 and 629 of FIG. 6.

In operation, a reference frequency, F1, may be generated by the signal generator 102 and the delay circuit 128 may receive F1 and generate an output frequency F2. However, in order for F2 to be equal (at least approximately) to 2*F1, the delay circuit 128 may need to be tuned as described in FIGS. 3 and 4. Accordingly, the delay circuit 128 may be adjusted via the control block 108. In this regard, the SSI 106 and the signal 118 may provide feedback and may enable the optimizing the adjustment of the control block.

Figure 2:
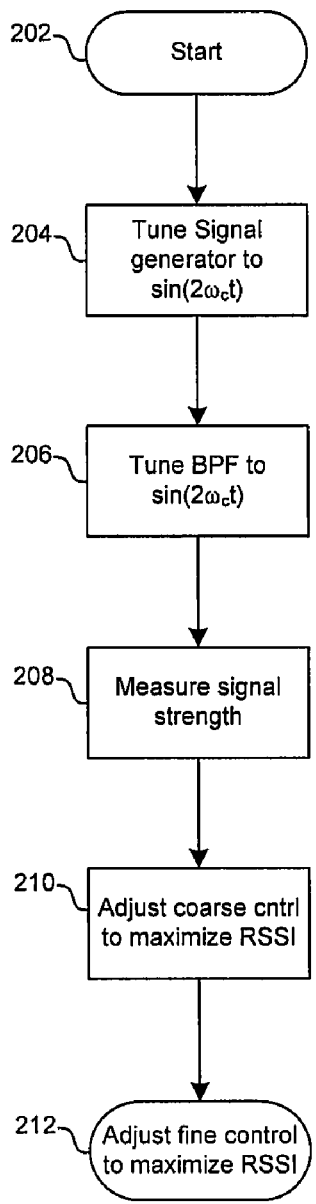
FIG. 2 is a flow chart illustrating exemplary steps for controlling a delay circuit for the generation of signals up to extremely high frequencies.

FIG. 2 is a flow chart illustrating exemplary steps for controlling a delay circuit for the generation of signals up to extremely high frequencies. The exemplary steps are described with respect to the system illustrated in FIG. 1. Referring to FIG. 2, the exemplary steps may begin with start step 202. Subsequent to step 202, the exemplary steps may advance to the step 204. In step 204, the signal generator 102 may be tuned to F1. In this regard, F1 may be chosen to be half of a desired LO frequency, for example. Subsequent to step 204, the exemplary steps may advance to step 206. In step 206, the BPF 104 may be tuned to 2*F1. In this regard, 2*F1 may be a desired LO frequency, for example. Subsequent to step 206, the exemplary steps may advance to step 208. In step 208, the SSI 106 may measure the strength, power or voltage for example, of the signal 112. Subsequent to step 208, the exemplary steps may advance to step 210. In step 210, the control block 108 may adjust the coarse tune input 114 of the delay circuit 128 in order to approximately maximize the strength of the signal 112. Subsequent to step 210, the exemplary steps may advance to step 212. In step 212, the control block 108 may adjust the fine tune input 116 of the delay circuit 128 in order to more precisely maximize the strength of the signal 112.

FIG. 3 is a block diagram illustrating the use of a delay circuit for the generation of signals of up to extremely high frequencies, in accordance with an embodiment of the invention. Referring to FIG. 3 there is shown a delay circuit 128 which may comprise a plurality of delay elements 306, a plurality of capacitances 308, a switching element 310, and a mixer 304.

The delay elements 306 may comprise suitable logic, circuitry, and/or code that may enable delaying an RF signal. In an exemplary embodiment of the invention, the delay elements 306 may comprise CMOS buffers and/or inverters. Additionally, there may be a plurality of 'n' delay elements $306_1, 306_2, \ldots, 306_n$. In one embodiment of the invention, each delay element 306 may introduce a time delay 'T'. In other embodiments of the invention, each of the delay elements 306 may be enabled to generate a fixed phase delay. Accordingly, in one aspect of the invention, a plurality of the delay elements may be configured so as to generate a variable delay.

Each of the capacitances 308 may comprise one or more capacitors which may be programmably controlled. In one embodiment of the invention, each capacitance 308 may comprise a plurality of capacitors coupled via a switch network. Accordingly, the capacitance may be controlled via a digital control word. In another embodiment of the invention, each capacitance 308 may comprise one or more varactors which may be programmably controlled via one or more voltages. The processor 625 of FIG. 7 may be utilized to generate or acquire the digital control words, which may be utilized for programmably controlling the capacitance 308.

The switching element 310 may comprise suitable logic, circuitry, and/or code that may enable selecting which delay element 306 output to route to the mixer 304. An amount by which a signal is delayed may be proportional to the number of delay elements 306 through which the signal propagates. In this manner, the amount of delay introduced may be coarsely tuned by altering the number of delay elements through which a signal propagates. Accordingly, a number of delay elements which introduces a delay closest to 90° may be selected.

The mixer 304 may comprise suitable logic, circuitry, and/or code that may enable generation of inter-modulation products resulting from mixing the input signal 312 and the delayed signal 314. In various embodiments of the invention the output of the mixer may be filtered such that desired inter-modulation products are passed with less attenuation than undesired inter-modulation products. For example, the output may be bandpass filtered with a center frequency of $2*F_{in}$.

In operation, the delay circuit 128 may enable doubling the frequency of an input signal 312. In this regard, the input signal 312 a reference frequency, $F_{in}$, may be represented as $\sin(\omega_c t)$, where '$\omega_c$' is angular frequency and 't' is time and may be coupled to the mixer 304 and a first of one or more delay elements 306. The one or more delay elements 306 combined with one or more capacitances 308 may enable delaying $F_{in}$ by 90°; thus generating a signal which may be represented by $\cos(\omega_c t)$. In this regard, controlling the number of delay elements 306 through which the signal propagates may enable course control of the amount of delay. Additionally, controlling the amount of capacitance 308 may enable fine control of the amount of delay. The delayed signal 314 may be applied to a second input of the mixer 304. Accordingly, mixing a signal that may be represented by $\sin(\omega_c t)$ with signal that may be represented by $\cos(\omega_c t)$ may result in a signal that may be represented by $\sin(2\omega_c t)$.

Figure 4:
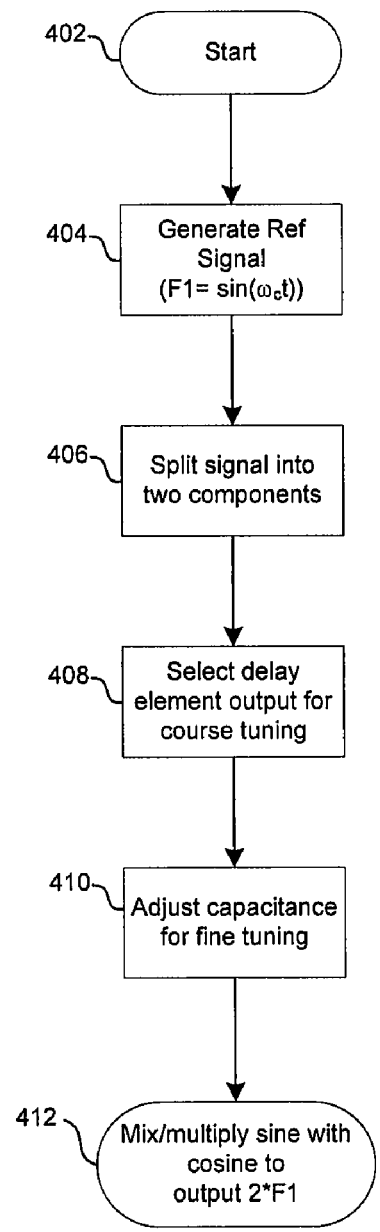
FIG. 4 is a flow chart illustrating exemplary steps for generating signals utilizing a delay circuit, in accordance with an embodiment of the invention.

FIG. 4 is a flow chart illustrating exemplary steps for generating signals utilizing a delay circuit, in accordance with an embodiment of the invention. Referring to FIG. 4 the exemplary steps may begin with start step 402. Subsequent to step 402 the exemplary steps may advance to step 404. In step 404, a reference signal may be generated by, for example, a phase locked loop (PLL), a direct digital frequency synthesizer (DDFS), or other signal generation block. In this regard, the reference signal may be of frequency F1. Subsequent to step 404, the exemplary steps may advance to step 406. In step 406, the reference signal may be replicated or split resulting in two identical (or nearly identical) signals. Subsequent to step 406, the exemplary steps may advance to step 408. In step 408, a number of delay elements comprising a delay chain may be selected such that the first signal may be delayed by approximately 90° relative to the second signal. Subsequent to step 408, the exemplary steps may advance to step 410. In step 410, a capacitance coupled to the second signal may be adjusted such that the delay of the first signal is more precisely equal to 90°. In this manner, the first signal may be equal to $\cos(\omega_c t)$ while the second (non-delayed) signal may be equal to $\sin(\omega_c t)$. Subsequent to step 412 the exemplary steps may advance to step 412. In step 412, the first signal ($\cos(\omega_c t)$) may be mixed or multiplied with the second signal ($\sin(\omega_c t)$) to output a signal of $\sin(2\omega_c t)$ which has frequency 2*F1.

Figure 5:
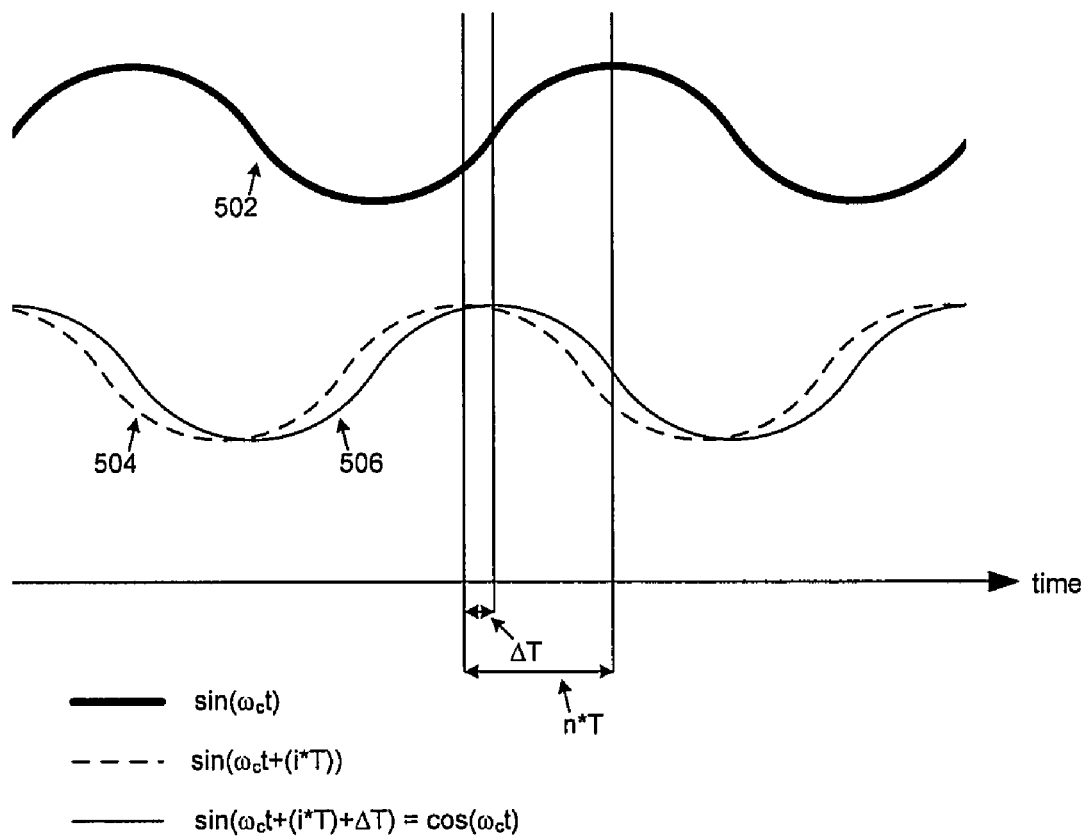
FIG. 5 is a diagram illustrating operation of a delay circuit, in accordance with an embodiment of the invention.

FIG. 5 is a diagram illustrating operation of a delay circuit, in accordance with an embodiment of the invention. Referring to FIG. 5 there is shown a sine wave 502, and two delayed signals 504 and 506.

The sine wave 502 may, for example, comprise a reference signal such as the input signal 312 of FIG. 3. In this regard, the sine wave 502 may be output by a signal generator circuit such as a phase locked loop (PLL) or a direct digital frequency synthesizer (DDFS). In this regard, a maximum frequency of the sine wave 502 may be limited due to limitations of the signal generation circuit. Accordingly, by utilizing high speed delay circuits and a mixer, higher frequencies may be generated from the signal 502.

The signal 504 may comprise a delayed version of the signal 502. In this regard, the signal 504 may be delayed by an integer multiple of fixed time periods, T. Accordingly, the signal 504 may be the output of a cascade of one or more delay elements 306. In this manner, by controlling the number of delay elements 306 through which the signal 502 propagates, the signal 504 may be delayed by an amount roughly equal to 90° relative the signal 502.

The signal 506 may comprise a delayed version of the signal 502. In this regard, the signal 506 may be delayed by an integer multiple of fixed time periods, T, plus an amount ΔT. Accordingly, the signal 506 may be the output of a cascade of one or more delay elements 306 with one or more capacitances 308 coupled to the output of the one or more delay elements. In this manner, by controlling the capacitance 308, the signal 506 may be delayed by an amount more precisely equal to 90° relative the signal 502.

Figure 6:
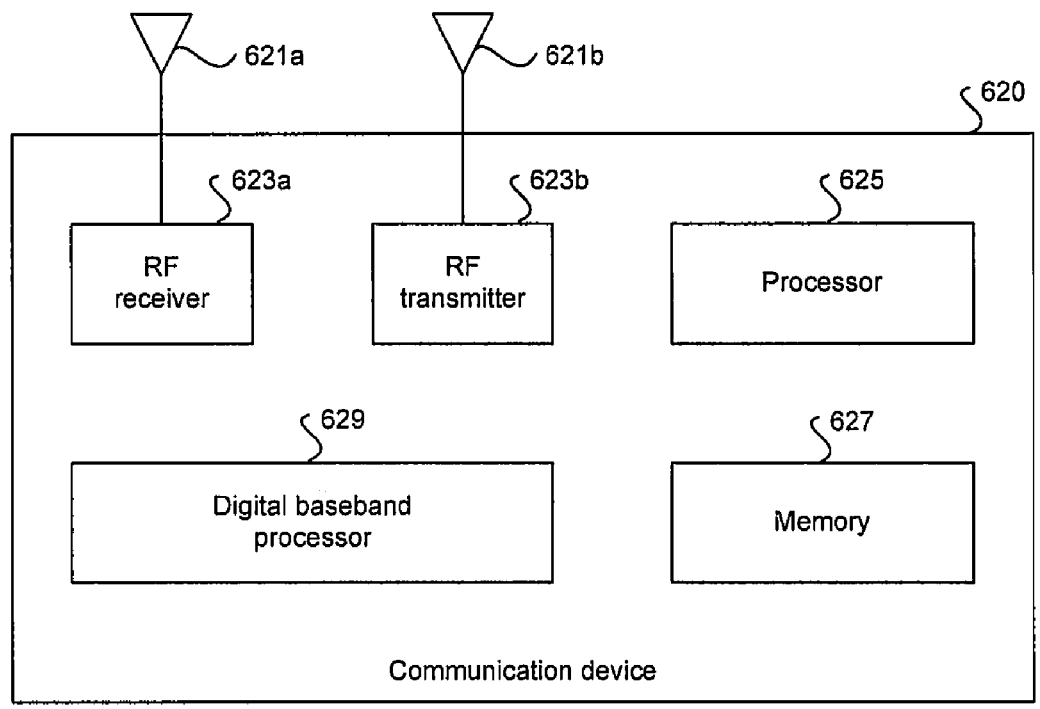
FIG. 6 is a block diagram illustrating an exemplary RF communication device, in accordance with an embodiment of the invention.

FIG. 6 is a block diagram illustrating an exemplary RF communication device, in accordance with an embodiment of the invention. Referring to FIG. 6, there is shown a RF communication device 620 that may comprise an RF receiver 623a, an RF transmitter 623b, a digital baseband processor 629, a processor 625, and a memory 627. A receive antenna 621a may be communicatively coupled to the RF receiver 623a. A transmit antenna 621b may be communicatively coupled to the RF transmitter 623b. The RF communication device 620 may be operated in a system, such as the cellular network and/or digital video broadcast network, for example.

The RF receiver 623a may comprise suitable logic, circuitry, and/or code that may enable processing of received RF signals. The RF receiver 623a may enable receiving extremely high frequency (EHF) signals of, for example, approximately 20 GHz. In this regard, the receiver may be enabled to generate signals, such as local oscillator signals, for the reception and processing of EHF signals. The RF receiver 623a may down-convert received RF signals to a baseband frequency signal. The RF receiver 623a may perform direct down-conversion of the received RF signal to a baseband frequency signal, for example. In some instances, the RF receiver 623a may enable analog-to-digital conversion of the baseband signal components before transferring the components to the digital baseband processor 629. In other instances, the RF receiver 623a may transfer the baseband signal components in analog form.

The digital baseband processor 629 may comprise suitable logic, circuitry, and/or code that may enable processing and/or handling of baseband frequency signals. In this regard, the digital baseband processor 629 may process or handle signals received from the RF receiver 623a and/or signals to be transferred to the RF transmitter 623b. The digital baseband processor 629 may also provide control and/or feedback information to the RF receiver 623a and to the RF transmitter 623b based on information from the processed signals. In this regard, the baseband processor 629 may provide one or more control signals to the signal generator 102, the delay block 128, the bandpass filter 104, the SSI 106, and/or the control block 108. The digital baseband processor 629 may communicate information and/or data from the processed signals to the processor 625 and/or to the memory 627. Moreover, the digital baseband processor 629 may receive information from the processor 625 and/or to the memory 627, which may be processed and transferred to the RF transmitter 623b for transmission to the network.

The RF transmitter 623b may comprise suitable logic, circuitry, and/or code that may enable processing of RF signals for transmission. The RF transmitter 623b may enable transmission of extremely high frequency (EHF) signals of, for example, approximately 20 GHz. In this regard, the receiver may be enabled to generate signals, such as local oscillator signals, for the reception and processing of EHF signals. The RF transmitter 623b may up convert the baseband frequency signal to an RF signal. The RF transmitter 623b may perform direct up-conversion of the baseband frequency signal to a baseband frequency signal, for example. In some instances, the RF transmitter 623b may enable digital-to-analog conversion of the baseband signal components received from the digital baseband processor 629 before up conversion. In other instances, the RF transmitter 623b may receive baseband signal components in analog form.

The processor 625 may comprise suitable logic, circuitry, and/or code that may enable control and/or data processing operations for the RF communication device 620. The processor 625 may be utilized to control at least a portion of the RF receiver 623a, the RF transmitter 623b, the digital baseband processor 629, and/or the memory 627. In this regard, the processor 625 may generate at least one signal for controlling operations within the RF communication device 620. In this regard, the processor 625 may provide one or more control signals to the signal generator 102, the delay block 128, the bandpass filter 104, the SSI 106, and/or the control block 108. The processor 625 may also enable executing of applications that may be utilized by the RF communication device 620. For example, the processor 625 may execute applications that may enable displaying and/or interacting with content received via RF signals in the RF communication device 620.

The memory 627 may comprise suitable logic, circuitry, and/or code that may enable storage of data and/or other information utilized by the RF communication device 620. For example, the memory 627 may be utilized for storing processed data generated by the digital baseband processor 629 and/or the processor 625. The memory 627 may also be utilized to store information, such as configuration information, that may be utilized to control the operation of at least one block in the RF communication device 620. In this regard, the memory 627 may comprise information necessary to configure the RF receiver 623a to enable receiving signals in the appropriate frequency band. For example, the memory 627 may store information for configuring and/or controlling the signal generator 102, the delay block 128, the bandpass filter 104, the SSI 106, and/or the control block 108.

Aspects of a method and system for generation of signals up to extremely high frequencies using a delay circuit are provided. In this regard, a variable delay circuit 128 may be adjusted such that an output signal 110 generated by the delay circuit 128 may be twice the frequency, F1, of a signal input to the delay circuit. The adjustment may be via a variable capacitance 308 and/or a variable number of delay elements 306 utilized to generate the output signal 110. Moreover, the adjustment may be based on a signal strength of the output signal 110. In this regard, the delay may be adjusted to maximize the signal strength of the signal 112. The input signal may be delayed to generate a second signal 314 that is 90° phase shifted relative to the input signal. The second signal 314 and the input signal may be mixed to generate the output signal 110. The output signal may be filtered by a bandpass filter 104 centered at twice the frequency, F1, of the input signal. Accordingly, the center frequency of the bandpass filter may be tunable.

Another embodiment of the invention may provide a machine-readable storage, having stored thereon, a computer program having at least one code section executable by a machine, thereby causing the machine to perform the steps as described herein for controlling a delay circuit for generation of signals up to extremely high frequency.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
adjusting a delay of a variable delay circuit such that a frequency of an output signal generated from said delay circuit is twice a frequency of an input signal to said delay circuit, wherein said adjusting is based on a strength of said output signal.

2. The method according to claim 1, comprising delaying said input signal to generate a second signal that is 90° phase shifted relative to said input signal; and
mixing said input signal with said second signal to generate said output signal.

3. The method according to claim 1, comprising adjusting said variable delay such that said signal strength is maximized.

4. The method according to claim 1, comprising programmatically adjusting said delay circuit.

5. The method according to claim 1, comprising filtering said output signal utilizing a bandpass filter centered at twice said frequency of said input signal.

6. The method according to claim 5, comprising programmatically controlling a center frequency of said bandpass filter.

7. The method according to claim 1, comprising adjusting a variable capacitance in said variable delay circuit.

8. The method according to claim 1, comprising adjusting a number of delay elements in said variable delay circuit utilized to generate said output signal.

9. A machine-readable storage having stored thereon, a computer program having at least one code section for signal processing, the at least one code section being executable by a machine for causing the machine to perform steps comprising:
adjusting a delay of a variable delay circuit such that a frequency of an output signal generated from said delay circuit is twice a frequency of an input signal to said delay circuit, wherein said adjusting is based on a strength of said output signal.

10. The machine-readable storage according to claim 9, wherein said at least one code section enables delaying said input signal to generate a second signal that is 90° phase shifted relative to said input signal; and said at least one code section enables mixing said input signal with said second signal to generate said output signal.

11. The machine-readable storage according to claim 9, wherein said at least one code section enables adjusting said variable delay such that said signal strength is maximized.

12. The machine-readable storage according to claim 9, wherein said at least one code section enables programmatically adjusting said delay circuit.

13. The machine-readable storage according to claim 9, wherein said at least one code section enables filtering said output signal utilizing a bandpass filter centered at twice said frequency of said input signal.

14. The machine-readable storage according to claim 13, wherein said at least one code section enables programmatically controlling a center frequency of said bandpass filter.

15. The machine-readable storage according to claim 9, wherein said at least one code section enables adjusting a variable capacitance in said variable delay circuit.

16. The machine-readable storage according to claim 9, wherein said at least one code section enables adjusting a number of delay elements in said variable delay circuit utilized to generate said output signal.

17. A system for signal processing, the system comprising:
one or more circuits that enable adjustment of a delay of a variable delay circuit such that a frequency of an output signal generated from said delay circuit is twice a frequency of an input signal to said delay circuit, wherein said adjusting is based on a strength of said output signal.

18. The system according to claim 17, wherein said one or more circuits enable a delay of said input signal to generate a second signal that is 90° phase shifted relative to said input signal; and
said one or more circuits mixes said input signal with said second signal to generate said output signal.

19. The system according to claim 17, wherein said one or more circuits enable adjustment of said variable delay such that said signal strength is maximized.

20. The system according to claim 17, wherein said one or more circuits enable programmatic adjustment of said delay circuit.

21. The system according to claim 17, wherein said one or more circuits filter said output signal utilizing a bandpass filter centered at twice said frequency of said input signal.

22. The system according to claim 21, wherein said one or more circuits enable programmatic control of a center frequency of said bandpass filter.

23. The system according to claim 17, wherein said one or more circuits enable adjustment of a variable capacitance in said variable delay circuit.

24. The system according to claim 17, wherein said one or more circuits enable adjustment of a number of delay elements in said variable delay circuit utilized to generate said output signal.

* * * * *